US012652009B2

(12) United States Patent
Riva et al.

(10) Patent No.: US 12,652,009 B2
(45) Date of Patent: Jun. 9, 2026

(54) TRANSCONDUCTANCE AMPLIFIER WITH AN INVERSE RELATIONSHIP BETWEEN A CONTROL VOLTAGE AND A TRANSCONDUCTANCE AND A SWITCHING REGULATOR USING THE TRANSCONDUCTANCE AMPLIFIER IN A FEEDBACK CIRCUIT

(71) Applicant: Allegro MicroSystems, LLC, Manchester, NH (US)

(72) Inventors: Alberto Riva, Cabiate (IT); Michele Suraci, Turate (IT)

(73) Assignee: Allegro MicroSystems, LLC, Manchester, NH (US)

( * ) Notice: Subject to any disclaimer, the term of this patent is extended or adjusted under 35 U.S.C. 154(b) by 700 days.

(21) Appl. No.: 18/168,782

(22) Filed: Feb. 14, 2023

(65) Prior Publication Data

US 2024/0275344 A1     Aug. 15, 2024

(51) Int. Cl.
| | |
|---|---|
| *H03F 3/45* | (2006.01) |
| *H02M 3/158* | (2006.01) |
| *H03F 1/08* | (2006.01) |
| *H03F 1/26* | (2006.01) |

(52) U.S. Cl.
CPC ...... *H03F 3/45183* (2013.01); *H02M 3/1582* (2013.01); *H03F 1/086* (2013.01); *H03F 1/26* (2013.01); *H03F 3/45475* (2013.01)

(58) Field of Classification Search
CPC ........ H03F 3/45183; H03F 1/086; H03F 1/26; H03F 3/45475; H03F 2203/45114; H03F 2203/45224; H03F 2203/45466; H03F 2203/45484; H03F 2203/45508; H02M 3/1582; H02M 1/0025; H02M 3/158
USPC ............................................................ 330/9
See application file for complete search history.

(56) References Cited

U.S. PATENT DOCUMENTS

| | | |
|---|---|---|
| 6,984,967 B2 | 1/2006 | Notman |
| 9,425,785 B1 | 8/2016 | Wibben |
| 9,537,383 B1 | 1/2017 | Wibben |
| 9,614,428 B2 | 4/2017 | Garvey et al. |
| 10,110,128 B2 | 10/2018 | Raval et al. |
| 10,181,791 B2 | 1/2019 | Kesarwani et al. |
| 10,291,125 B2 | 5/2019 | Raval et al. |
| 2020/0228012 A1* | 7/2020 | Lynch ................... H02M 3/158 |
| 2023/0299677 A1* | 9/2023 | Xu ...................... H02M 1/0009 323/282 |
| 2024/0243714 A1* | 7/2024 | Pattipaka ............ H03F 3/45475 |

OTHER PUBLICATIONS

Lloyd Dixon, Unitrode Application Note "U-140, Average Current Mode Control of Switching Power Supplies" 1999, 15 pages.

* cited by examiner

*Primary Examiner* — Andrea Lindgren Baltzell
*Assistant Examiner* — Jose E Pinero
(74) *Attorney, Agent, or Firm* — DALY, CROWLEY, MOFFORD & DURKEE, LLP

(57) ABSTRACT

A transconductance amplifier has a voltage input, a current output, and a control signal. A transconductance of the transconductance amplifier has an inverse relationship with the control signal. In some embodiments, the transconductance of the transconductance amplifier has a reciprocal relationship with the control signal. A switching voltage regulator uses the transconductance amplifier in a current control loop of a current mode switching regulator.

15 Claims, 7 Drawing Sheets

TRANSCONDUCTANCE AMPLIFIER WITH AN INVERSE RELATIONSHIP BETWEEN A CONTROL VOLTAGE AND A TRANSCONDUCTANCE AND A SWITCHING REGULATOR USING THE TRANSCONDUCTANCE AMPLIFIER IN A FEEDBACK CIRCUIT

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to transconductance amplifiers, and, more particularly, to a transconductance amplifier that has an inverse relationship between a control voltage and a transconductance and a switching regulator that uses the transconductance amplifier in a feedback circuit.

BACKGROUND

Transconductance amplifiers are known. A transconductance amplifier has a voltage input and a current output, wherein the current output has a magnitude directly related to the input voltage. A so-called transconductance is defined to be a ratio of the output current to the input voltage.

Some conventional transconductance amplifiers have fixed gains, not subject to gain control. In some applications, it would be desirable to provide a variable gain transconductance amplifier with particular gain control characteristics.

Various types of switching regulators are known. A buck converter is configured to receive an input supply voltage higher than a regulated output voltage. A boost converter is configured to receive an input supply voltage lower than a regulated output voltage.

Switching regulators are known to have particular arrangements of an inductor, a capacitor, and one or more switches. Switching regulators are also known to have feedback circuits to control the regulated output voltage.

Variable gain amplifiers can be used in conventional switching regulators. The variable gain is directly related to a sensed parameters, e.g., current supplied by the input supply voltage.

One type of switching regulator, known as a voltage mode control (VMC) regulator has a feedback circuit with one feedback loop. A voltage feedback loop senses the regulated output voltage and controls switches of the switching regulator to maintain a regulated voltage.

Another type of switching regulator, known as a current mode control (CMC) regulator, has a feedback circuit that has two feedback loops. A voltage (or outer) feedback loop senses the regulated output voltage and controls switches of the switching regulator to maintain a regulated voltage. A current (or inner) feedback loop senses the current provided by the input voltage supply and controls switches of the switching regulator to maintain a regulated average current.

There are different forms of current mode control regulators. In an average current mode control (ACMC) regulator, the sensed current is an average current. In a peak current mode control (PCMC) regulator, the sensed current is a peak current.

The conventional current feedback loop has a current loop amplifier with a fixed, i.e., constant, gain.

Dual loop current mode control regulators are known to have advantages over voltage control mode regulators. For example, current mode regulators can have better stability. Also, current mode regulators can have and better transient response when experiencing input voltage transients and output current transients, and improved regulation bandwidth.

However, both conventional voltage mode control regulators and also conventional current mode control regulators operate over only a restricted range of input supply voltage.

It would be desirable to provide a current mode control regulator that can operate over a wider range of input supply voltages.

SUMMARY

The present invention provided a variable gain transconductance amplifier that has a transconductance inversely related to a control voltage.

The present invention also provides a current mode control regulator that can operate over a wider range of input supply voltages.

In accordance with an example useful for understanding an aspect of the present invention, an electronic circuit can be disposed upon a semiconductor substrate. The electronic circuit can include a first node configured to receive a control voltage from outside of the electronic circuit. The electronic circuit can also include a second node configured to receive a first signal voltage from outside of the electronic circuit. The electronic circuit can further include a third node configured to generate a first current to outside of the electronic circuit. A relationship between the first current and the first signal voltage is described by a transconductance. The transconductance has an inverse relationship with the control voltage.

In some embodiments, the transconductance has a reciprocal relationship with the control voltage.

In accordance with another example useful for understanding another aspect of the present invention, a switching regulator has a voltage input terminal at which a supply voltage is received and an output terminal at which a regulated voltage is generated. The switching regulator includes a switch having first and second terminals and a control terminal. The switching regulator further includes an inductor, a capacitor, and a feedback circuit having first and second input terminals and an output terminal. The feedback circuit can include a current sensor configured to generate a current-related voltage signal. The current-related voltage signal can be related to a current passing into the inductor. The feedback circuit can further include a first transconductance amplifier. The first transconductance amplifier can include a first node configured to receive a control voltage. The control voltage can be related to the supply voltage. The first transconductance amplifier can further include a second node configured to receive a first signal voltage. The first signal voltage can be related to the current-related voltage signal. The first transconductance amplifier can further include a third node configured to generate a first current. The first transconductance amplifier can further include a fourth node configured to receive a second signal voltage. The second signal voltage can be related to the regulated voltage. The feedback circuit can further include a pulse width modulation circuit having an input terminal and an output terminal. The output terminal of the pulse width modulation circuit can be coupled to the control terminal of the switch, and the input terminal of the pulse width modulation circuit can be coupled to the third node of the first transconductance amplifier. The feedback circuit can further include an impedance circuit coupled between the third node and a reference voltage. The impedance circuit can be operable to generate a feedback voltage related to the first current and related to the regulated voltage. A relationship between the first current and a first voltage difference between the first signal voltage and the second signal voltage can be described by a transconductance. The transconductance has an inverse relationship with the control voltage.

In some embodiments, the transconductance has a reciprocal relationship with the control voltage.

BRIEF DESCRIPTION OF THE DRAWINGS

The foregoing features of the invention, as well as the invention itself may be more fully understood from the following detailed description of the drawings, in which.

DETAILED DESCRIPTION

Figure 1:
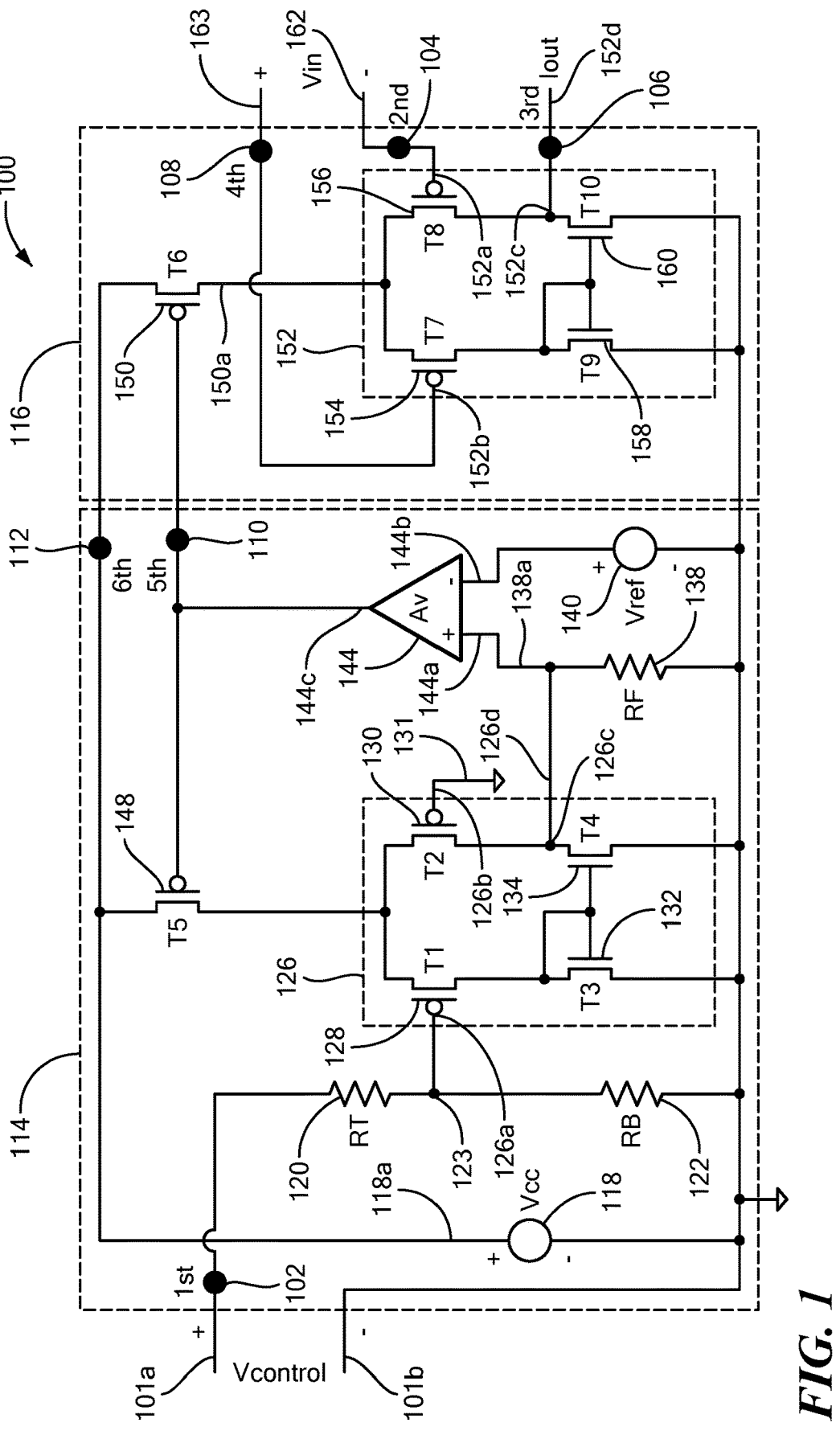
FIG. 1 is a schematic diagram showing an illustrative electronic circuit providing a variable gain transconductance amplifier having an inverse relationship between a control voltage and an output current.

Before describing the present invention, some introductory concepts and terminology are explained.

As used herein, the term "magnetic field sensing element" is used to describe a variety of electronic elements that can sense a magnetic field. The magnetic field sensing element can be, but is not limited to, a Hall effect element, a magnetoresistance element, a magnetotransistor, or an inductive coil. As is known, there are different types of Hall effect elements, for example, a planar Hall element and a vertical Hall element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe an assembly that uses one or more magnetic field sensing elements (part of an electronic circuit) in combination with another electronic circuit portion, all disposed upon a common substrate, e.g., a semiconductor substrate.

While electronic circuits shown in figures herein may be shown in the form of analog blocks or digital blocks (e.g., processors or modules), it will be understood that the analog blocks can be replaced by digital blocks (e.g., processors or modules) that perform the same or similar functions and the digital blocks can be replaced by analog blocks that perform the same or similar functions. Analog-to-digital or digital-to-analog conversions may not be explicitly shown in the figures but should be understood.

For example, it should be understood that a so-called comparator can be comprised of an analog comparator having a two-state output signal indicative of an input signal being above or below a threshold level (or indicative of one input signal being above or below another input signal). However, the comparator can also be comprised of a digital circuit (e.g., processor or module) having an output signal or value with at least two states indicative of an input signal or value being above or below a threshold level (or indicative of one input signal or value being above or below another input signal or value), respectively, or a digital signal or value above or below a digital threshold signal or value (or another digital signal or value), respectively.

As used herein, the term "direct relationship" is used to describe a relationship between two signals such that an increase in a first signal results in an increase in a second signal. For example, in a direct relationship, a first signal may be doubled in amplitude (e.g., amplitude=2) resulting in a second signal doubling in amplitude (e.g., amplitude=2). This example describes a linear direct relationship. However, nonlinear direct relationships are also possible.

As used herein, the term "inverse relationship" is used to describe a relationship between two signals such that an increase in a first signal results in a decrease in a second signal. For example, in an inverse relationship, a first signal may be doubled in amplitude (e.g., amplitude=2) resulting in a second signal halving in amplitude (e.g., amplitude=½). This example describes a linear inverse relationship. However, nonlinear inverse relationships are also possible.

As used herein, the term "reciprocal relationship" is used to describe a relationship between two signals such that an increase in a first signal results in a decrease in a second signal by an amount of one divided by the increase of the first signal. For example, in a reciprocal relationship, a first signal may be doubled in amplitude (e.g., amplitude=2) resulting in a second signal halving in amplitude (e.g., amplitude=½). Thus, a reciprocal relationship is a particular form of an inverse relationship.

As used herein, the term "amplifier" is used to describe a circuit element with a gain greater than one, less than one, or equal to one.

As used herein, the term "voltage amplifier" is used to describe a circuit element operable to receive an input voltage signal and operable to generate an output voltage signal responsive to the input voltage signal.

As used herein, the term "transconductance amplifier" is used to describe a circuit element operable to receive an input voltage signal and operable to generate an output current signal responsive to the input voltage signal.

FET transistor symbols used herein are shown to have a control terminal at which a voltage is received and two current passing terminals between which a current passed, wherein the current is responsive to the voltage. The FET transistor symbols have either a dot at the control terminal or no dot. The dot is indicative of a P-channel FET and the no dot is indicative of an N-channel FET.

Referring to FIG. 1, an illustrative electronic circuit 100 can be disposed upon a semiconductor substrate.

The electronic circuit 100 can include a first node 102 configured to receive a control voltage 101a, 101b from outside of the electronic circuit. Where the element labeled 101b is a reference voltage or a ground voltage, the control voltage 101a, 101b is actually a signal-ended voltage, and is, therefore, referred to herein as control voltage 101a.

The electronic circuit 100 can also include a second node 104 configured to receive a first signal voltage 162 from outside of the electronic circuit 100. The electronic circuit 100 can further include a third node 106 configured to generate a first current 152d to outside of the electronic circuit 100. A relationship between the first current 152d and the first signal voltage 162 is described by a transconductance. The transconductance has an inverse relationship with the control voltage 101a.

In some embodiments, the transconductance has a reciprocal relationship with the control voltage 101a.

In some embodiments, the electronic circuit 100 can include a fourth node 108 configured to receive a second signal voltage 163 from outside of the electronic circuit 100. The first current 152d has a direct relationship with a first voltage difference between the first and second signal voltages 162, 163.

The electronic circuit 100 can include a first electronic circuit portion 114 and a second electronic circuit portion 116 coupled to the first electronic circuit portion 114. The first electronic circuit portion 114 comprises the first node 102, a fifth node 110, and a sixth node 112. The first electronic circuit portion 114 is configured to generate a second voltage difference between the fifth node 110 and the sixth node 112. The second electronic circuit portion 116 comprises the second node 104, the third node 106, and the fourth node 108.

The second voltage difference between the fifth node 110 and the sixth node 112 of the first electronic circuit portion 114 has an inverse relationship with the control voltage 101a. The first current 152d generated at the third node 106 of the second electronic circuit portion 116 has a direct relationship with the second voltage difference between the fifth node 110 and the sixth node 112 of the first electronic circuit portion 114.

In some embodiments, second voltage difference between the fifth node 110 and the sixth node 112 of the first electronic circuit portion 114 has a reciprocal relationship with the control voltage 101a.

In some embodiments, the first electronic circuit portion 114 can include a first resistor 120 and a second resistor 122 coupled in a voltage divider having first and second ends and a junction terminal 123 coupling the first and second resistors, the first end of the voltage divider can be coupled to the first node 102 of the first electronic circuit portion 114.

In some embodiments, the first electronic circuit portion 114 can also include first, second, third, and fourth transistors 128, 130, 132, 134 coupled as a first differential transconductance amplifier 126 having first and second voltage input terminals 126a, 126b and a current output terminal 126c. The first voltage input terminal 126a of the first differential transconductance amplifier 126 can be coupled to the junction terminal 123 of the voltage divider and the second voltage input terminal 126b of the first differential transconductance amplifier 126 can be coupled to a reference voltage 131. The first differential transconductance amplifier 126 is configured to generate a comparison current 126d at the current output terminal 126c of the first differential transconductance amplifier 126.

In some embodiments, the first electronic circuit portion 114 can also include a resistor 138 coupled to the comparison current 126d, wherein the resistor 138 is configured to generate a comparison voltage 138a related to the comparison current 126d.

In some embodiments, the first electronic circuit portion 114 can also include a differential voltage amplifier 144 having first and second voltage input terminals 144a, 144b and a voltage output terminal 144c. The first voltage input terminal 144a of the differential voltage amplifier 144 can be coupled to the comparison voltage 138a and the second voltage input terminal 144b of the differential voltage amplifier 144 can be coupled to a first voltage source 140.

In some embodiments, the first electronic circuit portion 114 can also include a fifth transistor 148 having first and second current passing terminals and having a control terminal. The control terminal of the fifth transistor 148 can be coupled to the voltage output terminal 144c of the differential voltage amplifier 144. The second current passing terminal of the fifth transistor 148 can be coupled to the first differential transconductance amplifier 126 and the first current passing terminal of the fifth transistor 148 can be coupled to a second voltage source 118.

In some embodiments, the second electronic circuit portion 116 can include a sixth transistor 150 having first and second current passing terminals and having a control terminal. The control terminal of the sixth transistor 150 can be coupled to the control terminal of the fifth transistor 148. The first current passing terminal of the sixth transistor 150 can be coupled to the second voltage source 118.

In some embodiments, the second electronic circuit portion 116 can include seventh, eighth, ninth, and tenth transistors 154, 156, 158, 160 coupled as a second differential transconductance amplifier 152 having first and second voltage input terminals 152a, 152b and a current output terminal 152c.

The first voltage input terminal 152a of the second differential transconductance amplifier 152 can correspond to the second node 104 of the second electronic circuit portion 116. The second voltage input terminal 152b of the second differential transconductance amplifier 152 can correspond to the fourth node 108 of the second electronic circuit portion 116. The current output terminal 152c of the second differential transconductance amplifier 152 can correspond to the third node 106 of the second electronic circuit portion 116. The second current passing terminal of the sixth transistor 150 is configured to provide a bias current 150a to the second differential transconductance amplifier 152. The bias current 150a has an inverse relationship with the control voltage 101a received at the first node 102 of the first electronic circuit portion 114.

In some embodiments, the bias current 150a has a reciprocal relationship with the control voltage 101a received at the first node 102 of the first electronic circuit portion 114.

In operation, it should be apparent that the transconductance of the second differential transconductance amplifier 152 is influenced by a variable bias current provided by the sixth transistor 150. As the control voltage 101a is increased, the bias current and the transconductance of the second differential transconductance amplifier 152 both decrease.

To the above end, the first differential transconductance amplifier 126 generates a nearly constant current 126d to the resistor 138, in order to generate a voltage that attempts to match a voltage of the second voltage source 140. The match is provided by feedback of the differential voltage amplifier 144 that provides a bias current of the first differential transconductance amplifier 126 by the fifth transistor 148. It will be appreciated that, as the control voltage 101a is increased, the first voltage difference between the fifth and sixth nodes 110, 112 decreases, which results in a decrease of the bias current provided by the sixth transistor 150 and a decrease of the transconductance of the second differential transconductance amplifier 152 accordingly.

As described above, in operation, the voltage amplifier 144 amplifier keeps a substantially constant voltage at the first input terminal 144a equal to the voltage 142 generated by the voltage reference 140, regardless of the control voltage 101a. Therefore, current flowing in the resistor 138 is also substantially constant, resulting in a substantially constant voltage 138a. Thus, as the control voltage 101a changes, the transconductance of the first transconductance amplifier 126 changes accordingly as the control voltage 101a changes.

Mathematically the above can be expressed as:

$$V_{CONTROL}\frac{R_B}{R_B+R_T}gm_1 = \frac{V_{REF}}{R_F} \quad (1)$$

$$gm_1 = \frac{V_{REF}}{V_{CONTROL}}\frac{1}{R_F}\left(1+\frac{R_T}{R_B}\right) \quad (2)$$

where: $V_{CONTROL}$=control voltage 101a
$R_B$=resistor 122
$R_T$=resistor 120
$gm_1$=transconductance of first transconductance amplifier 126
$V_{REF}$=voltage 142
Hence the transconductance of the first transconductance amplifier 126 is inversely related to the control voltage 101a.

If the transistors of the first transconductance amplifier 126 are well matched to the transistors of the second transconductance amplifier 152, then the transconductance, $gm_1$, of the first transconductance amplifier 126 must be similar to, or the same as, the transconductance, $gm_2$, of the second transconductance amplifier 152. Therefore, the output current 152d at the third node 106 of the electronic circuit 100 can be expressed as:

$$I_{OUT,EA} = \Delta V_{IN,EA}gm_{EA} = \Delta V_{IN,EA}\left[\frac{V_{REF}}{V_{CONTROL}}R_F\left(1+\frac{R_T}{R_B}\right)\right] \quad (3)$$

where: $1_{OUT, EA}$=output current 152d at the third node 106
$\Delta V_{IN,EA}$=first voltage difference 162, 163
$gm_{EA}=gm_1=gm_2=$ overall transconductance of the electronic circuit 100
$V_{CONTROL}$=control voltage 101a
Thus, the output current 152d, $I_{OUT.EA}$, of the electronic circuit 100 is inversely proportional to the control voltage 101a. In other word, the transconductance of the electronic circuit 100 is inversely proportional to the control voltage 101a. In some embodiments, the relationship is a reciprocal relationship.

Figure 2:
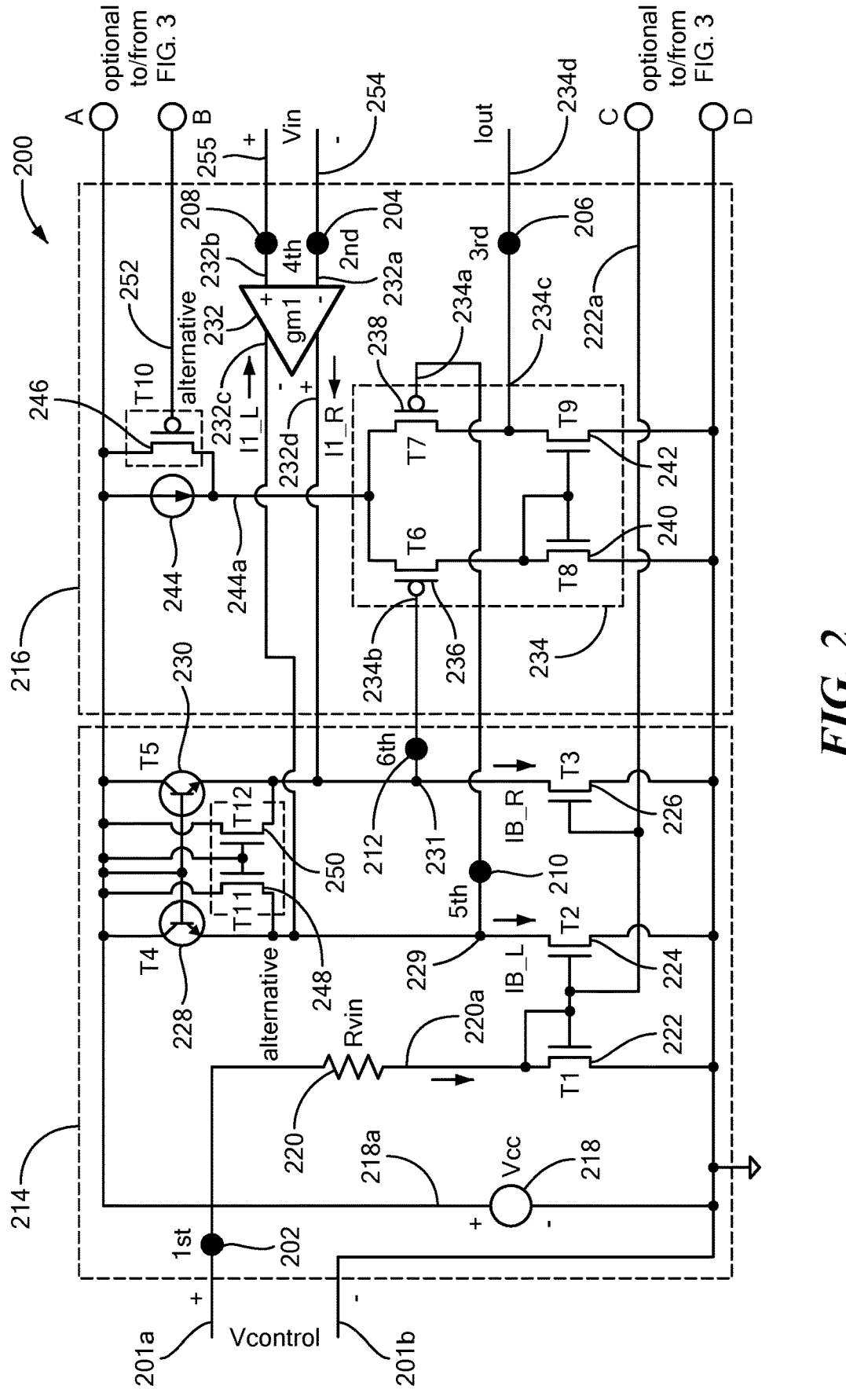
FIG. 2 is a schematic diagram showing another illustrative electronic circuit providing a variable gain transconductance amplifier having an inverse relationship between a control voltage and an output current.

Referring to FIG. 2, another illustrative electronic circuit 200 can be disposed upon a semiconductor substrate.

The electronic circuit 200 can include a first node 202 configured to receive a control voltage 201a, 201b from outside of the electronic circuit. Where the element labeled 201b is a reference voltage or a ground voltage, the control voltage 201a, 201b is actually a signal-ended voltage, and is, therefore, referred to herein as control voltage 201a.

The electronic circuit 200 can also include a second node 204 configured to receive a first signal voltage 254 from outside of the electronic circuit 200. The electronic circuit 200 can further include a third node 206 configured to generate a first current 234d to outside of the electronic circuit 200. A relationship between the first current 234d and the first signal voltage 254 is described by a transconductance. The transconductance has an inverse relationship with the control voltage 201a.

In some embodiments, the transconductance has a reciprocal relationship with the control voltage 201a.

In some embodiments, the electronic circuit 200 can include a fourth node 208 configured to receive a second signal voltage 255 from outside of the electronic circuit 200. The first current 234d has a direct relationship with a first voltage difference between the first and second signal voltages 254, 255.

The electronic circuit 200 can include a first electronic circuit portion 214 and a second electronic circuit portion 216 coupled to the first electronic circuit portion 214. The first electronic circuit portion 214 comprises the first node 202, a fifth node 210, and a sixth node 212. The first electronic circuit portion 214 is configured to generate a second voltage difference between the fifth node 210 and the sixth node 212. The second electronic circuit portion 216 comprises the second node 204, the third node 206, and the fourth node 208.

The second voltage difference between the fifth node 210 and the sixth node 212 of the first electronic circuit portion 214 has an inverse relationship with the control voltage 201a. The first current 234d generated at the third node 206 of the second electronic circuit portion 216 has a direct relationship with the second voltage difference between the fifth node 210 and the sixth node 212 of the first electronic circuit portion 214.

In some embodiments, second voltage difference between the fifth node 210 and the sixth node 212 of the first electronic circuit portion 214 has a reciprocal relationship with the control voltage 201a.

In some embodiments, the first electronic circuit portion 214 can include a resistor 220 having first and second terminals, the first terminal of the resistor 220 coupled to the first node 202 of the first electronic circuit portion 214 and operable to receive the control voltage 201*a*.

In some embodiments, the first electronic circuit portion 214 can also include a first transistor 222 having first and second current passing terminals and having a control terminal. The control terminal of the first transistor 222 can be coupled to the first current passing terminal of the first transistor 222 and the second terminal of the resistor 220 can be coupled to the control terminal of the first transistor 222.

In some embodiments, the first electronic circuit portion 214 can also include a second transistor 224 having first and second current passing terminals and having a control terminal. The control terminal of the second transistor 224 can be coupled to the control terminal of the first transistor 222. The second transistor 224 can form a first current mirror with the first transistor 222.

In some embodiments, the first electronic circuit portion 214 can also include a third transistor 226 having first and second current passing terminals and having a control terminal. The control terminal of the third transistor 226 can be coupled to the control terminal of the first transistor 222. The third transistor 226 can form a second current mirror with the first transistor 222.

In some embodiments, the first electronic circuit portion 214 can also include a fourth transistor 228 having first and second current passing terminals and having a control terminal. The control terminal of the fourth transistor 228 can be coupled to a voltage source 218. The first current passing terminal of the fourth transistor 228 can be coupled to the voltage source 218. The second current passing terminal of the fourth transistor 228 can be coupled to the first current passing terminal of the second transistor 224 at a first junction terminal 229.

In some embodiments, the first electronic circuit portion 214 can also include a fifth transistor 230 having first and second current passing terminals and having a control terminal. The control terminal of the fifth transistor 230 can be coupled to the voltage source 218. The first current passing terminal of the fifth transistor 230 can be coupled to the voltage source 218. The second current passing terminal of the fifth transistor 230 can be coupled to the first current passing terminal of the third transistor 226 at a second junction terminal 231.

In some embodiments, the fourth and fifth transistors 228, 230 are BJT transistors.

In some embodiments, the first junction terminal 229 corresponds to the fifth node 210 of the first electronic circuit portion 214.

In some embodiments, the second junction terminal 231 corresponds to the sixth node 212 of the first electronic circuit portion 214.

In some embodiments, the second electronic circuit portion 216 can also include a first differential transconductance amplifier 232 having first and second voltage input terminals 232*a*, 232*b* and first and second current output terminals 232*c*, 232*d*. The first current output terminal 232*c* of the first differential transconductance amplifier 232 can be coupled to the second current passing terminal of the fourth transistor 228. The second current output terminal 232*d* of the first differential transconductance amplifier 232 can be coupled to the second current passing terminal of the fifth transistor 230.

In some embodiments, the second electronic circuit portion 216 can include sixth, seventh, eighth, and ninth transistors 236, 238, 240, 242 coupled as a second differential transconductance amplifier 234 having first and second voltage input terminals 234*a*, 234*b* and a current output terminal 234*c*.

The first voltage input terminal 232*a* of the first differential transconductance amplifier 232 can correspond to the second node 204 of the second electronic circuit portion 216. The second voltage input terminal 232*b* of the first differential transconductance amplifier 232 can correspond to the fourth node 208 of the second electronic circuit portion 216. The second current output terminal 234*c* of the second differential transconductance amplifier 234 can correspond to the third node 206 of the second electronic circuit portion 216.

In some embodiments, a current source 244 can provide a constant bias current to the second differential transconductance amplifier 234.

In operation, unlike the electronic circuit 100 of FIG. 1, it should be apparent that a constant bias current is provided by the current source 244 to the second differential transconductance amplifier 234. In order to influence the overall transconductance of the electronic circuit 200, instead, currents passing through the sixth and seventh transistors 236, 238 are influenced by operation of the second, third, fourth, and fifth transistor 224, 226, 228, 230, also in concert with variable current provided by the second differential transconductance amplifier 232. As the control voltage 201*a* is increased, the second voltage difference between the fifth node 210 and the sixth node 212 of the first electronic circuit portion 214 decreases, and therefore, the first current 234*d* generated at the third node 206 of the second electronic circuit portion 216 also decreases, therefore, the overall transconductance of the electronic circuit 200 decreases.

In the electronic circuit 200, variable current is used to bias the fourth and fifth transistors 228, 230, BJTs, which act as loads.

Considering that the output currents of the first differential transconductance amplifier 232 are much lower than the currents that are used to bias the fourth and fifth transistors 228, 230, BJTs, in the input voltage range of interest and since the fourth and fifth transistors 228, 230 have a transconductance proportional to the input current, it results that the load resistances are inversely proportional to the input voltage.

The following mathematical relationships can describe the electronic circuit 200: Transconductance of the fourth and fifth transistors 228, 230, here BJTs, can be expressed as:

$$I_{B\_L} = I_{B\_R} = I_B = \frac{V_{CONTROL} - V_{GS}}{R_{VIN}} \tag{4}$$

$$gm_{BJT,L} = gm_{BJT,R} = gm_{BJT} = \frac{I_B}{V_T} = \frac{V_{CONTROL} - V_{GS}}{V_T R_{VIN}} \tag{5}$$

where: $I_{B\_L}$=current passing through the second transistor 224

$I_{B\_R}$=current passing through the third transistor 226

$V_{CONTROL}$=control voltage 201*a*

$V_{GS}$=gate source voltage of the first transistor 222

$R_{VIN}$=resistor 220

$gm_{BJT,L}$=transconductance of fourth transistor 228

$gm_{BJT,R}$=transconductance of fifth transistor 230

$V_T$= thermal voltage

Output currents 232*c*, 232*d* of the first transconductance amplifier 232 are not considered in the calculation of the transconductance of the fourth and fifth transistors 228, 230, BJTs, since they are small signal currents. Therefore, the output current 234*d* at the third node 206 can be expressed as:

$$I_{OUT,EA} = \Delta V_{IN,EA} gm_1 \frac{gm_2}{gm_{BJT}} \quad (6)$$

$$I_{OUT,EA} = \Delta V_{IN,EA} gm_1 \frac{V_T}{V_{CONTROL} - V_{GS}} R_{VIN} gm_2 \quad (7)$$

where: $I_{OUT,EA}$=output current 234*d* at the third node 206
$\Delta V_{IN,EA}$=first voltage difference 254, 255
$gm_{BJT}$=transconductance of the fourth and fifth transistors 228, 230
$gm_1$=transconductance of the first differential transconductance amplifier 232
$gm_2$=transconductance of the second diff. transconductance amplifier 234
$R_{VIN}$=resistor 220
$V_T$= thermal voltage
$V_{CONTROL}$=control voltage 201*a*
$V_{GS}$=gate source voltage of the first transistor 222
The overall transconductance of the electronic circuit 200 is:

$$gm_{EA} = \frac{I_{OUT,EA}}{\Delta V_{IN,EA}} = gm_1 \frac{V_T}{V_{CONTROL} - V_{GS}} R_{VIN} gm_2 \quad (8)$$

The $V_{GS}$ term could be compensated in various manners. How, ever in some applications with a relatively high $V_{CONTROL}$, $V_{GS}$ can be considered to be negligible. Thus, the overall transconductance of the electronic circuit 200 can be expressed as:

$$gm_{EA} \cong gm_1 \frac{V_T}{V_{CONTROL}} R_{VIN} gm_2 \quad (9)$$

Thus, the transconductance of the electronic circuit 200, is inversely proportional to the control voltage 201*a*. In some embodiments, the relationship is a reciprocal relationship.

In an alternative arrangement, like that of the sixth transistor 150 of FIG. 1, the current source 244 can be replaced with a tenth transistor 246 and bias current provided to the second differential transconductance amplifier 234 can be controlled by the electronic circuit of FIG. 3 described below, coupled at terminals labeled A, B, C and D. In this alternative arrangement, advantageously, the fourth and fifth transistors 228, 230, i.e., BJT transistors, can be replaced by eleventh and twelfth transistors 248, 250, i.e., FET transistors, coupled as shown.

Figure 3:
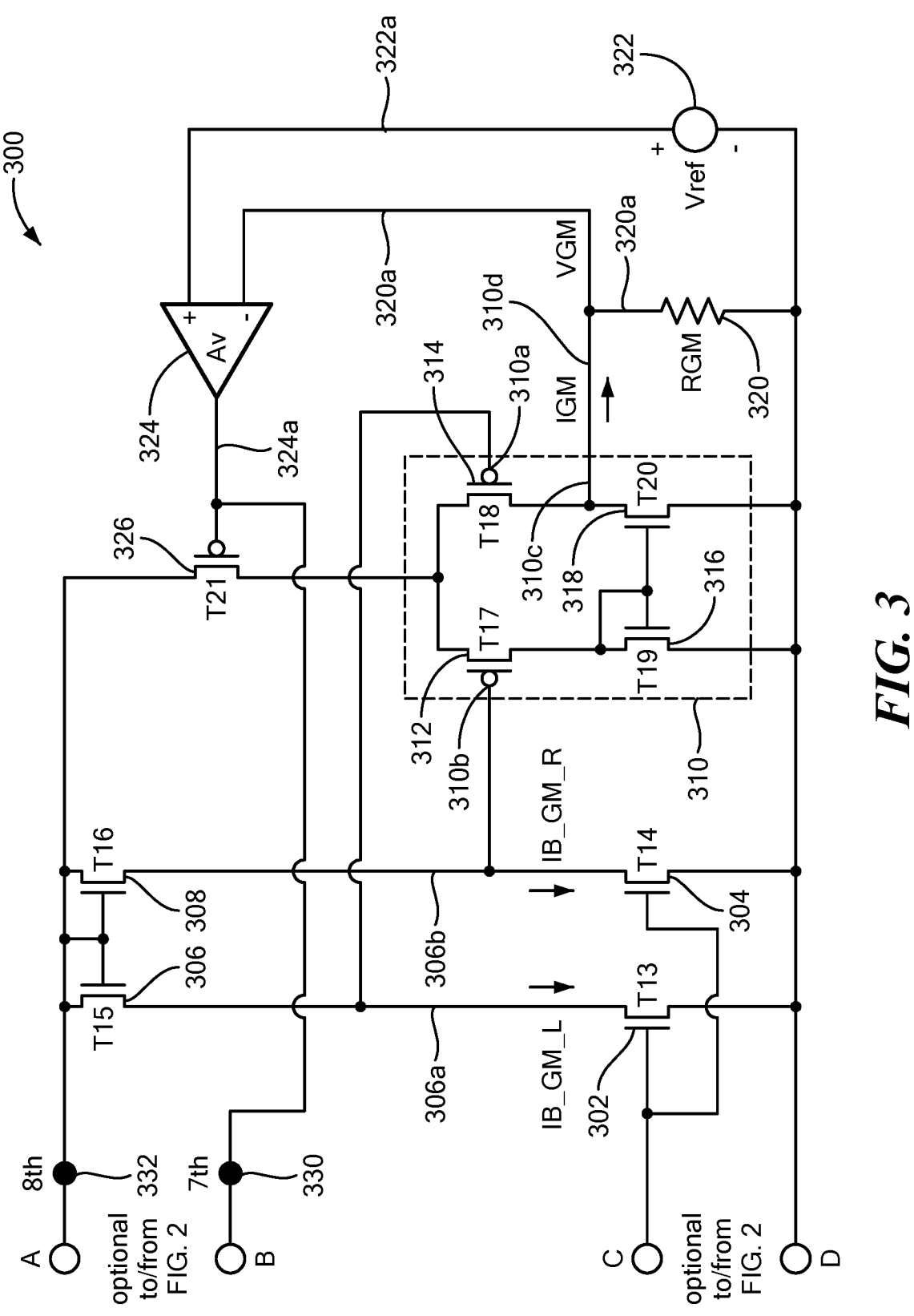
FIG. 3 is a schematic diagram showing an illustrative electronic circuit portion that can be used in conjunction with the electronic circuit of FIG. 2, together providing a variable gain transconductance amplifier having an inverse relationship between a control voltage and an output current.

Referring now to FIG. 3 in combination with FIG. 2, a third electronic circuit portion 300 can include thirteenth and fourteenth transistors 302, 304 coupled as current mirrors to the first transistor 222 of FIG. 2.

The third electronic circuit portion 300 can include fifteenth and sixteen transistors 306, 308 coupled as trans-diodes to provide currents to the thirteenth and fourteenth transistors, 302, 304, respectively.

In some embodiments, the third electronic circuit portion 300 can include seventeenth, eighteenth, nineteenth, and twentieth transistors 312, 314, 316, 318 coupled as a third differential transconductance amplifier 310 having first and second voltage input terminals 310*a*, 310*b* and a current output terminal 310*c* at which a comparison current 310*d* can be generated.

In some embodiments, the third electronic circuit portion 300 can also include a resistor 320 coupled to the comparison current 310*d*, wherein the resistor 320 is configured to generate a comparison voltage 320*a* related to the comparison current 310*d*.

In some embodiments, the third electronic circuit portion 300 can also include a differential voltage amplifier 324 having first and second voltage input terminals and a voltage output terminal. The first voltage input terminal of the differential voltage amplifier 324 can be coupled to the comparison voltage 320*a* and the second voltage input terminal of the differential voltage amplifier 324 can be coupled to a second voltage source 322.

In some embodiments, the third electronic circuit portion 300 can also include a twenty-first transistor 326 having first and second current passing terminals and having a control terminal. The control terminal of the twenty-first transistor 326 can be coupled to the voltage output terminal of the differential voltage amplifier 324. The second current passing terminal of the twenty-first transistor 326 can be coupled to the third differential transconductance amplifier 310 and the first current passing terminal of the twenty-first transistor 326 can be coupled to the voltage source 218 of FIG. 2.

As described above in conjunction with FIG. 2, in some embodiments, the second electronic circuit portion 2 of FIG. 2 can include the tenth transistor 246 having first and second current passing terminals and having a control terminal. The control terminal of the tenth transistor 246 can be coupled to the control terminal of the twenty-first transistor 326.

Comparison can be made between elements of FIG. 1, which control a bias current provided by the sixth transistor and elements of FIG. 3, which control a bias current provided by the tenth transistor 246 of FIG. 2. In essence, as the control voltage 201*a* is increased, a voltage difference between seventh and eighth nodes 330, 332 decreases, resulting in a decrease of bias current provided by the tenth transistor 246 and a resulting decrease of the transconductance of the second differential transconductance amplifier 234.

Figure 4:
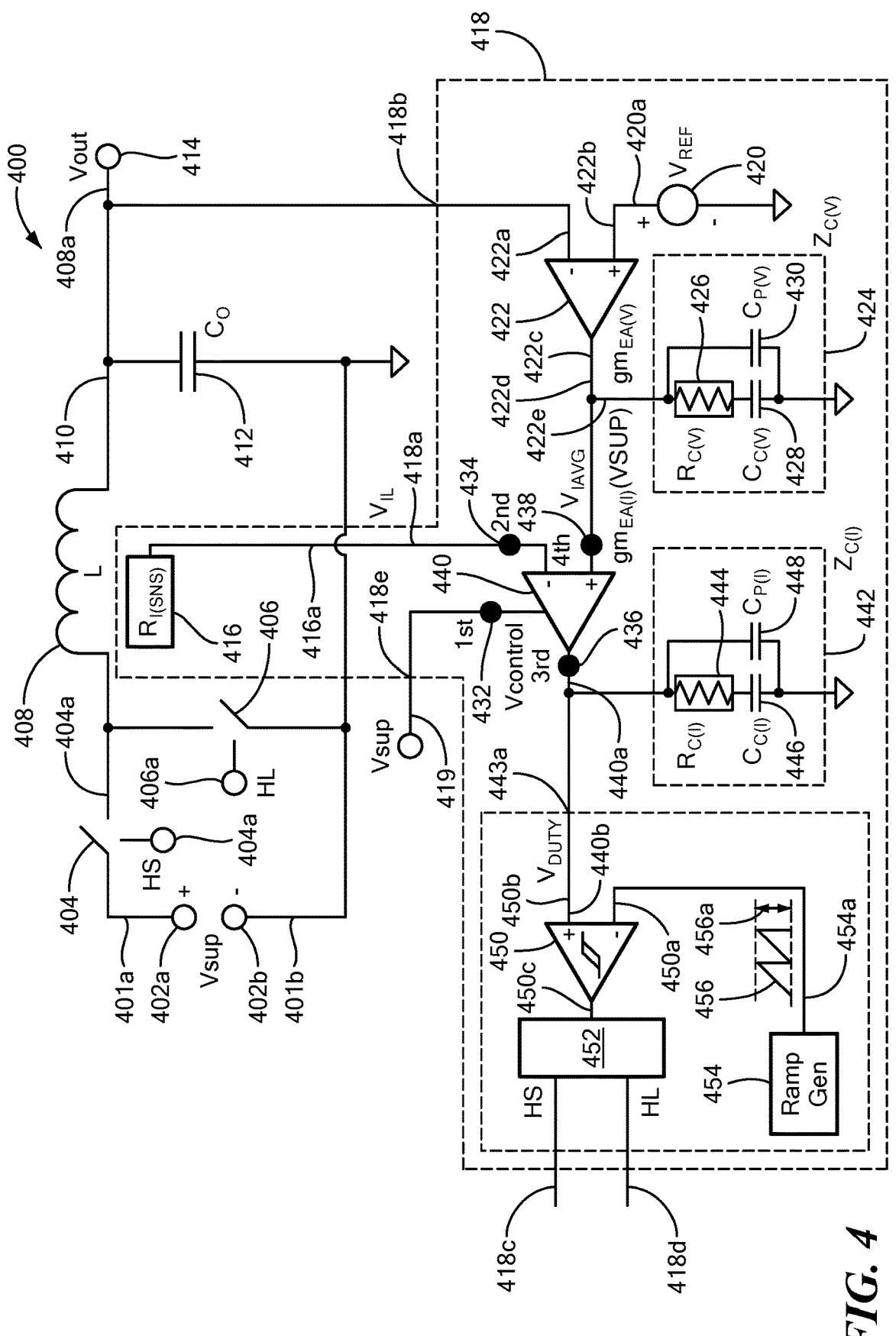
FIG. 4 is a schematic diagram showing of a switching regulator having the variable gain transconductance amplifier of FIG. 1 or 2, with or without the electronic circuit portion of FIG. 3.

Referring now to FIG. 4, a switching regulator 400 can include the electronic circuit 100 or the electronic circuit 200 (with or without the electronic circuit portion 300) as will become apparent. Reference is also made below to elements of FIGS. 1 and 2.

A switching regulator 400 has a voltage input terminal 402*a*, 402*b* at which a supply voltage 401*a*, 401*b*, Vsup, is received and an output terminal 414 at which a regulated voltage 408*a* is generated. Where the element labeled 401*b* is a reference voltage or a ground voltage, the supply voltage 401*a*, 401*b* is actually a signal-ended voltage, and is, therefore, referred to herein as supply voltage 401*a*.

The switching regulator 400 includes a switch 404 having first and second terminals and a control terminal 404*a*. The switching regulator 400 further includes an inductor 408, a capacitor 412, and a feedback circuit 418 having first and second input terminals 418*a*, 418*b* and an output terminal 418*c*, 418*d*.

In some embodiments, the switching regulator 400 can include a second switch 406 having first and second terminals and a control terminal 406*a*. However, it will be recognized that, in some embodiments, the switch 406 can be replaced with a diode.

The feedback circuit 418 can include a current sensor 416, e.g., a magnetic field sensor or a magnetic field sensing element described above, configured to generate a current-related voltage signal 416a. The current-related voltage signal 416a can be related to a current passing into the inductor 408.

The current sensor 416 is labeled $R_{I(SNS)}$ to indicate that the current sensor 416 can be considered to generate a voltage equivalent to that which would be generated by a resistor in series with the inductor 408.

The feedback circuit 418 can further include a first transconductance amplifier 440. The first transconductance amplifier 440 can be of a type as described in conjunction with FIG. 1 or 2. Thus, as described in conjunction with FIG. 1 or 2, the first transconductance amplifier 440 can include a first node 432 configured to receive a control voltage 419. The control voltage 419 can be related to the supply voltage 401a.

The first transconductance amplifier 440 can further include a second node 434 configured to receive a first signal voltage. The first signal voltage can include the current-related voltage signal 416a.

The first transconductance amplifier 440 can further include a third node 436 configured to generate a first current 440a.

The first transconductance amplifier 440 can further include a fourth node 438 configured to receive a second signal voltage 422e. The second signal voltage can be related to the regulated voltage 408a.

The feedback circuit 418 can further include a pulse width modulation circuit 443 having an input terminal 443a and an output terminal 418c, 418d. The output terminal 418c of the pulse width modulation circuit 443 can be coupled to the control terminal 404a of the switch 404 and the input terminal 443a of the pulse width modulation circuit 443 can be coupled to the third node 436 of the first transconductance amplifier 440.

For embodiments that use the second switch 406, the output terminal 418d of the pulse width modulation circuit 443 can be coupled to the control terminal 406a of the second switch 406.

The feedback circuit 418 can further include an impedance circuit 442 coupled between the third node 436 and a reference voltage, e.g., ground. The impedance circuit 442 can be operable to generate a feedback voltage 440b related to the first current 440a and related to the regulated voltage 408a. A relationship between the first current 440a and a first voltage difference between the first signal voltage 416a and the second signal voltage 422d can be described by a transconductance. The transconductance has an inverse relationship with the control voltage 419, i.e., an inverse relationship with the supply voltage 401a.

In some embodiments, the transconductance has a reciprocal relationship with the control voltage 419, i.e., a reciprocal relationship with the supply voltage 401a.

As described above in conjunction with FIGS. 1 and 2, the first transconductance amplifier 440 can include a first electronic circuit portion 114, 214 and a second electronic circuit portion 116, 216 coupled to the first electronic circuit portion 114, 214. The first electronic circuit portion 114, 214 comprises the first node 102, 202, 432 and fifth and sixth nodes 110, 210, 112, 212. The first electronic circuit portion 114, 214 is configured to generate a second voltage difference between the fifth and sixth nodes 110, 210, 112, 212.

The second electronic circuit portion 116, 216 comprises the second, the third, and the fourth nodes 104, 204, 434, 106, 206, 436, 108, 208, 438.

The second voltage difference between the fifth and sixth nodes 110, 210, 112, 212 of the first electronic circuit portion 114, 214 has an inverse relationship with the control voltage 101a, 201a, 419.

In some embodiments, the second voltage difference between the fifth and sixth nodes 110, 210, 112, 212 of the first electronic circuit portion 114, 214 has a reciprocal relationship with the control voltage 101a, 201a, 419.

The first current generated 440a at the third node 436 of the second electronic circuit portion 116, 216 has a direct relationship with the second voltage difference between the fifth and sixth nodes 110, 210, 112, 212 of the first electronic circuit portion.

In some embodiments, the feedback circuit 418 further includes a feedback amplifier 422 coupled to the output terminal 414 of the switching regulator 400. The feedback amplifier 422 has first and second input terminals 422a, 442b, and an output terminal 422c. The feedback amplifier 422 is configured to generate a voltage 422e at the output terminal 422c of the feedback amplifier 422 related to the regulated voltage 408a at the output terminal 414 of the switching regulator 400. The output terminal 422c of the feedback amplifier 422 is coupled to the fourth node 438 of the first transconductance amplifier 440.

In some embodiments, the feedback amplifier 422 can be a second transconductance amplifier, in which case, the voltage 422e results from the feedback amplifier 422 generating a current 422d interacting with a second impedance circuit 424 coupled to the output terminal 422c of the feedback amplifier 422.

A voltage source 420 can supply a voltage reference to the second input terminal 422b of the feedback amplifier 422.

In some embodiments, the pulse width modulation circuit 443 can include a ramp generator circuit 454 for generating a periodic ramp signal 454a, 456.

In some embodiments, the pulse width modulation circuit 443 can further include a comparator 450 having first and second input terminals 450a, 450b and an output terminal 450c. The first input terminal 450a of the comparator 450 can be coupled to the period ramp signal 454a, 456 and the second input terminal 450b of the comparator 450 can be coupled to the third node 436 of the first transconductance amplifier 440.

In some embodiments, the pulse width modulation circuit 443 can include a logic gate circuit 452 coupled between the output terminal 450c of the comparator and the control terminal 404a of the switch 404.

In some embodiments, the periodic ramp signal 454a, 456 has a constant peak amplitude 456a regardless of a value of the supply voltage at the voltage input terminal 402a of the switching regulator 400.

As a result of the constant peak amplitude, the switching regulator does not suffer noise issues presented by conventional switching relators that use a periodic ramp signal that varies in amplitude in accordance with a supply voltage.

In contrast, it should be appreciated that conventional average current mode switching regulators employ a periodic ramp signal with a peak amplitude that directly varies in accordance with a supply voltage (i.e., input voltage). The conventional average current mode switching regulators use the varying peak amplitude of the periodic ramp signal to obtain some level of stability over some range of supply voltages. However, it should be understood that low supply voltages and corresponding low values of the peak amplitude (and corresponding low slope of the periodic ramp signal) tend to result in high noise and a resulting high noise of the regulated voltage. The conventional average current mode switching regulators that use the varying peak amplitude of the periodic ramp signal also result in a reduction in a bandwidth of the current loop and a resulting degradation of load regulation (output transient response).

In contrast, in some embodiments of the switching regulator 400, the peak amplitude of the periodic ramp signal is held at a constant amplitude, wherein signal to noise ratio and transient response are not degraded as the supply voltage varies.

The switching regulator 400 is shown to be in the form of a buck converter, for which a supply voltage is greater than a regulated voltage. However, it should be appreciated that other forms of switching regulator can include the electronic circuit 100 or the electronic circuit 200 (with or without the electronic circuit portion 300). For example, another switching regulator may be in the form of a boost converter for which a supply voltage is less than a regulated voltage.

In some embodiments, the feedback circuit 418 is operable to provide stable operation of the switching regulator 400 for a ratio of variation of the supply voltage 401*a*, 401*b* (maximum supply voltage divided by the minimum supply voltage at which the switching regulator 400 is stable) of at least 20.

In some embodiments, the current sensor 416 includes a Hall element disposed proximate to the current 404*a* or the current 410. In some embodiments, the current sensor 416 includes a magnetoresistance element disposed proximate to the current 404*a* or the current 410. In some embodiments, the current sensor 416 includes an inductive coil disposed proximate to the current 404*a* or the current 410. In some embodiments, the current sensor 416 includes a resistor disposed in series with the current 404*a*. In some embodiments, the current sensor 416 includes a resistor disposed in series with the current 410.

In some embodiments, the feedback circuit 418 is operable to provide stable operation of the switching regulator 400 for a ratio of the variation of the supply voltage 401*a*, 401*b* of at least fifteen.

In some embodiments, the feedback circuit 418 is operable to provide stable operation of the switching regulator 400 for a ratio of the variation of the supply voltage 401*a*, 401*b* of at least twenty-five.

In some embodiments, the impedance circuit 442 can include a resistor 444, $R_{C(I)}$, coupled in series with a capacitor 446, $C_{C(I)}$, and another capacitor 448, $C_{P(I)}$, coupled across the resistor 444 and capacitor 446.
In Some Embodiments:

$$R_{C(I)} = 50 \text{ k}\Omega$$

$$C_{C(I)} = 50 \text{ pF}$$

$$C_{P(I)} = 3 \text{ pF}$$

In some embodiments, the second impedance circuit 424 can include a resistor 426, $R_{C(V)}$, coupled in series with a capacitor 428, $C_{C(V)}$, and another capacitor 430, $C_{P(V)}$, coupled across the resistor 426 and capacitor 428.
In Some Embodiments:

$$R_{C(V)} = 400 \text{ k}\Omega$$

$$C_{C(V)} = 80 \text{ pF}$$

-continued $$C_{P(V)} = 1 \text{ pF}$$

In some embodiments, the inductor 408 has a value of 6.8 micro-Henries.

In some embodiments, the capacitor 412 has a value of 20 micro-Farads.

In some embodiments, the periodic ramp signal 454*a*, 456 has a frequency of about 2 MHz and a period of about 500 ns.

In some embodiments, the peak value 456*a* of the periodic ramp signal 454*a*, 456 is about two volts.

In some embodiments, the voltage 420*a* of the voltage source 420 is about one volt.

In some embodiments, the regulated voltage 408*a* is about twelve volts. In some embodiments, stable operation can be achieved for supply voltages 401*a* from about three volts to about seventy-five volts.

In some embodiments, all elements of the feedback circuit 418 are integrated upon a single semiconductor substrate. In other embodiments, one or more elements of the impedance circuit 424, 442 are separate and not integrated within the semiconductor substrate.

A stability of the switching regulator 400 has little of no influence from variations of the supply voltage 401*a*. It will be understood that stability of the switching regulator 400 is dominated by a stability of the current loop having the first transconductance amplifier 440. In order to address stability of the current loop, a loop gain of the current loop can be examined below.

An open loop gain of the current loop, considering only the frequencies near its unity gain frequency, and opening the loop at the second node 434 to force an AC voltage at terminal 418*a*, and reading the loop response by the voltage 416*a*, and also considering the voltage loop (outer loop) not effective at the frequencies of interest since it is designed on purpose with a much lower unity gain frequency to ensure an overall system stability, the open loop gain can be described as:

$$G_{LOOP(I)}(s) \approx \gamma \cdot \frac{V_{IN} \cdot R_{I(SNS)} \cdot gm_{EA(I)} \cdot R_{C(I)}}{sL \cdot V_{R(MAX)}} \tag{10}$$

As stated above, the equation 10 is valid only for frequencies that are near the unity gain frequency of the current loop. Under that condition, a proper designed compensation network 442 for the current loop has an impedance that is substantially equal to the resistance 444.

where: $\gamma$=parameter that considers the effects of the sampling $V_{IN}$=supply voltage 401*a*, Vsup $R_{I(SNS)}$=resistor equivalent to the current sensor 416 as described above $gm_{EA(I)}(V_{IN})$=transconductance of the first transconductance amplifier 440

$R_{C(I)}$=resistor 444 s=complex angular frequency

L=inductance of the inductor 408

$V_{R(MAX)}$=peak amplitude 456a of the periodic ramp signal 456

Equation (11) can be arranged as follows:

$$G_{LOOP(I)}(s) \approx \gamma \cdot \frac{V_{IN} \cdot gm_{EA(I)}(V_{IN}) \cdot R_{I(SNS)} \cdot R_{C(I)}}{sL \cdot V_{R(MAX)}} \tag{11}$$

Because, as described in conjunction with FIGS. 1-4, the transconductance of the transconductance amplifier 100, 200 and of the first transconductance amplifier 440 has an inverse relationship (or, in some embodiments, a reciprocal relationship) with the input voltage (control voltage 101a, 201a and supply voltage 401a) the following substitution can be made:

$$gm_{EA(I)}(V_{IN}) \cong \frac{I_{KEA(I)}}{V_{IN}} \qquad (12)$$

where: $I_{KEA(I)}$=constant current that models the proportionality of the transconductance of the first transconductance amplifier 440 with the input voltage (control voltage 101a, 201a and supply voltage 401a).

$$G_{LOOP(I)}(s) \approx \gamma \cdot \frac{I_{KEA(I)} \cdot R_{I(SNS)} \cdot R_{C(I)}}{sL \cdot V_{R(MAX)}} \qquad (13)$$

In equation (13), there is no dependence on the input voltage $V_{IN}$, and thus, stability should not be influenced, or should be minimally influenced, by the input voltage $V_{IN}$.

Figure 5:
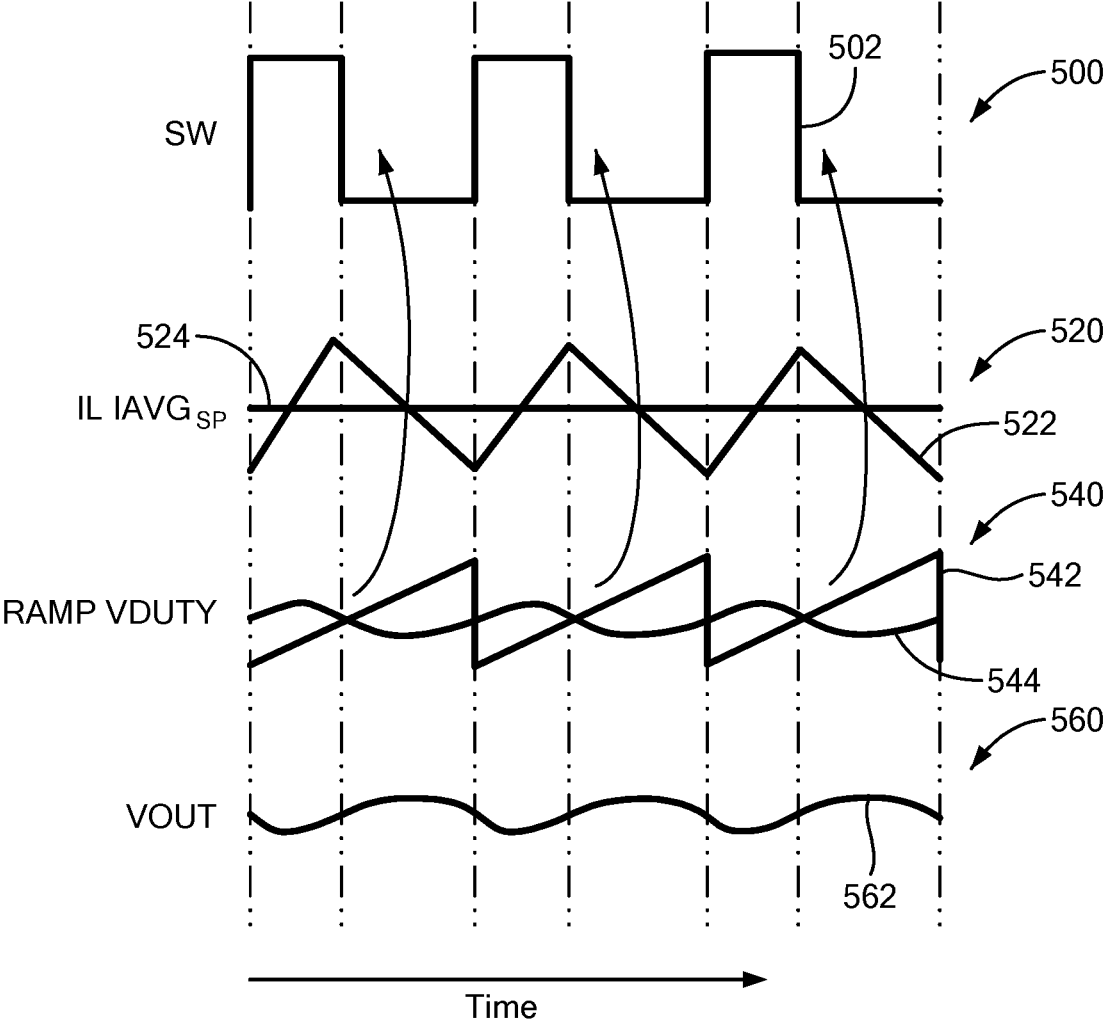
FIG. 5 is graph showing illustrative signal waveforms associated with the switching regulator of FIG. 4.

Referring now to FIGS. 4 and 5, graphs 500, 540, 560 each have a horizontal axis in units of time in arbitrary units and respective vertical axes with scales in units of volts in arbitrary units.

The graph 520 has a horizontal axis in units of time in arbitrary units and a vertical axis in units of electrical current in arbitrary units.

The graph 520 shows a first signal 522 is indicative of an illustrative instantaneous operating current as sensed by the current sensor 416 of FIG. 4. A second signal 524 is indicative of an average current flowing into or out of the inductor 408 of FIG. 4.

The graph 560 shows a signal 562 indicative of an illustrative signal like the regulated voltage 408a of FIG. 4.

The graph 540 shows a first signal 542 indicative of an illustrative periodic ramp signal like the periodic ramp signal 454a, 456 of FIG. 4. The graph 540 shows a second signal 544 indicative of an illustrative signal like the feedback voltage 440b generated by the first transconductance amplifier 440 of FIG. 4.

The graph 500 shows a signal 502 indicative of a signal generated at the output terminal 450c of the comparator 450 of FIG. 4.

Figure 6:
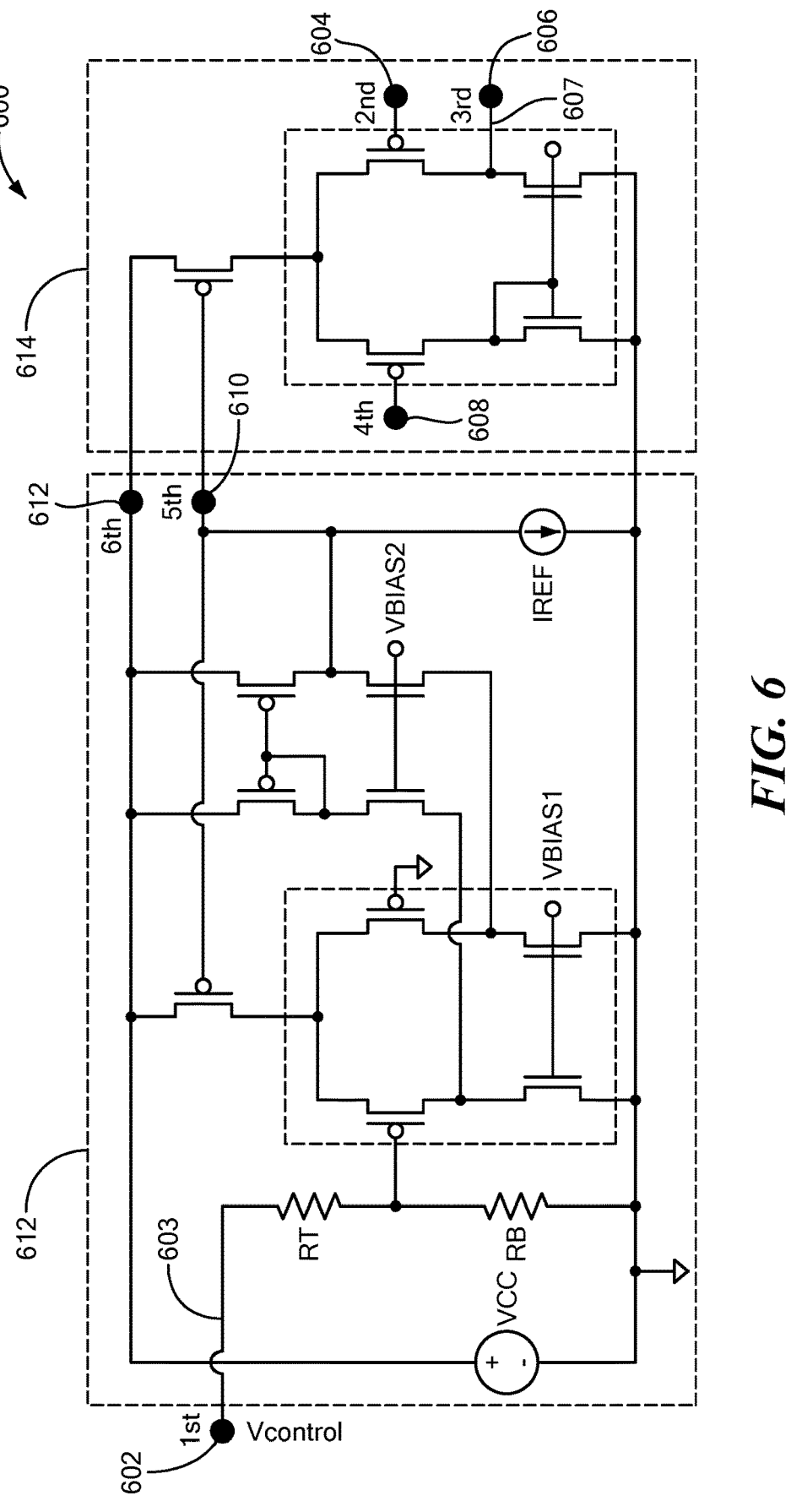
FIG. 6 is a schematic diagram showing another illustrative electronic circuit providing a variable gain transconductance amplifier having an inverse relationship between a control voltage and an output current.
Figure 7:
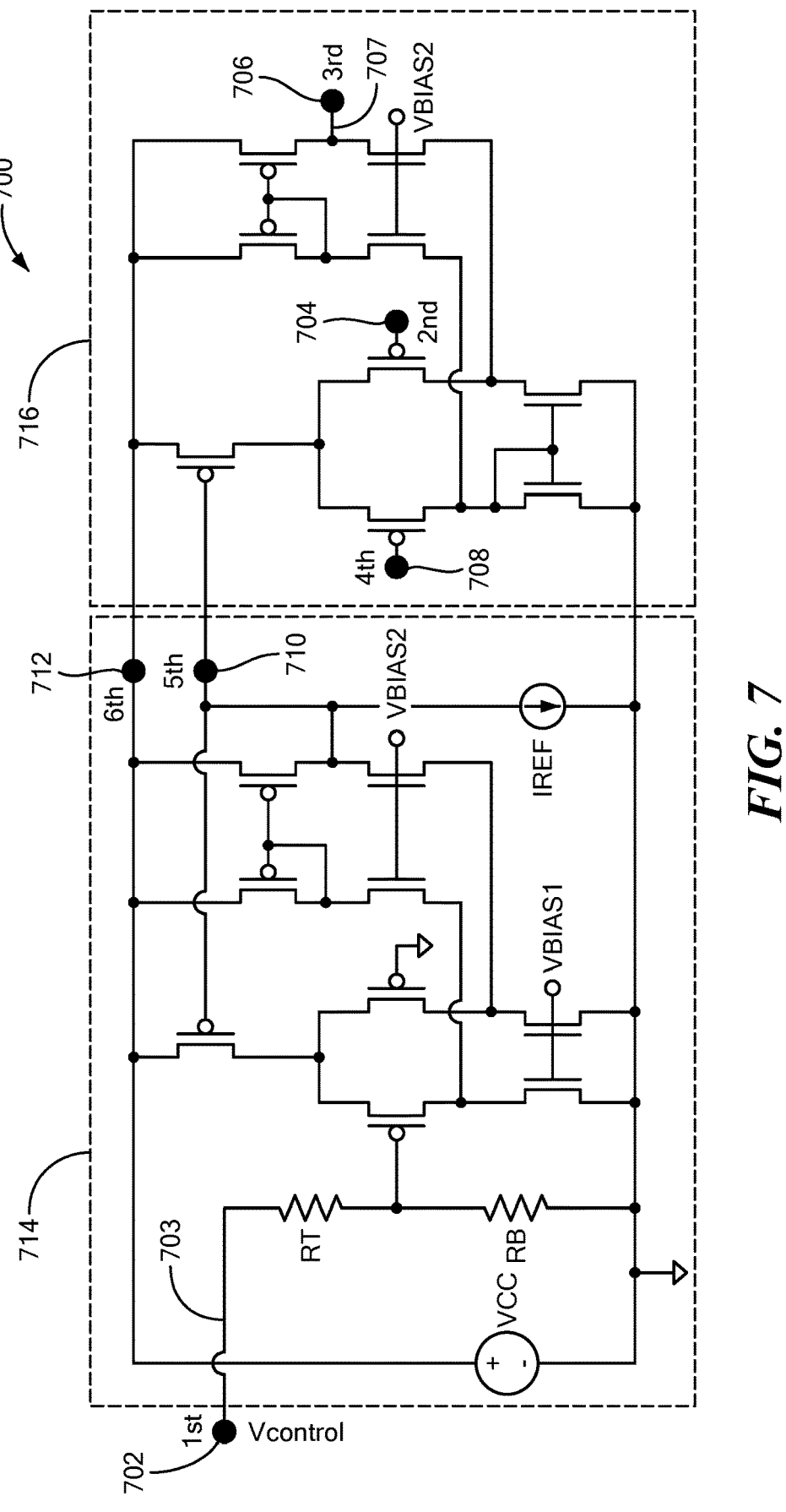
FIG. 7 is a schematic diagram showing another illustrative electronic circuit providing a variable gain transconductance amplifier having an inverse relationship between a control voltage and an output current.

Referring now FIGS. 6 and 7, illustrative electronic circuits 600, 700 can include nodes that have characteristics the same as or similar to same designated nodes described above in conjunction with FIGS. 1 and 2. Functions of the electronic circuits 600, 700 are not described in detail herein, but will be understood from discussion of FIGS. 1-3 above. FIGS. 6 and 7 are presented herein as examples of other ones of various electronic circuits that can have a transconductance that varies in an inverse fashion or in a reciprocal fashion with respect to a control voltage.

Referring now to FIG. 6, an illustrative electronic circuit 600 can be disposed upon a semiconductor substrate.

The electronic circuit 600 can include a first node 602 configured to receive a control voltage 603 from outside of the electronic circuit.

The electronic circuit 600 can also include a second node 604 configured to receive a first signal voltage from outside of the electronic circuit 600. The electronic circuit 600 can further include a third node 606 configured to generate a first current 607 to outside of the electronic circuit 600. A relationship between the first current 607 and the first signal voltage is described by a transconductance. The transconductance has an inverse relationship with the control voltage 603.

In some embodiments, the transconductance has a reciprocal relationship with the control voltage 603.

In some embodiments, the electronic circuit 600 can include a fourth node 608 configured to receive a second signal voltage from outside of the electronic circuit 600. The first current 607 has a direct relationship with a first voltage difference between the first and second signal voltages.

The electronic circuit 600 can include a first electronic circuit portion 614 and a second electronic circuit portion 616 coupled to the first electronic circuit portion 614. The first electronic circuit portion 614 comprises the first node 602, a fifth node 610, and a sixth node 612. The first electronic circuit portion 614 is configured to generate a second voltage difference between the fifth node 610 and the sixth node 612. The second electronic circuit portion 616 comprises the second node 604, the third node 606, and the fourth node 608.

The second voltage difference between the fifth node 610 and the sixth node 612 of the first electronic circuit portion 614 has an inverse relationship with the control voltage 603. The first current 607 generated at the third node 606 of the second electronic circuit portion 616 has a direct relationship with the second voltage difference between the fifth node 610 and the sixth node 612 of the first electronic circuit portion 614.

In some embodiments, second voltage difference between the fifth node 610 and the sixth node 612 of the first electronic circuit portion 614 has a reciprocal relationship with the control voltage 603.

Referring now to FIG. 7, an illustrative electronic circuit 700 can be disposed upon a semiconductor substrate.

The electronic circuit 700 can include a first node 702 configured to receive a control voltage 703 from outside of the electronic circuit.

The electronic circuit 700 can also include a second node 704 configured to receive a first signal voltage from outside of the electronic circuit 700. The electronic circuit 700 can further include a third node 706 configured to generate a first current 707 to outside of the electronic circuit 700. A relationship between the first current 707 and the first signal voltage is described by a transconductance. The transconductance has an inverse relationship with the control voltage 703.

In some embodiments, the transconductance has a reciprocal relationship with the control voltage 703.

In some embodiments, the electronic circuit 700 can include a fourth node 708 configured to receive a second signal voltage from outside of the electronic circuit 700. The first current 707 has a direct relationship with a first voltage difference between the first and second signal voltages.

The electronic circuit 700 can include a first electronic circuit portion 714 and a second electronic circuit portion 716 coupled to the first electronic circuit portion 714. The first electronic circuit portion 714 comprises the first node 702, a fifth node 710, and a sixth node 712. The first electronic circuit portion 714 is configured to generate a second voltage difference between the fifth node 710 and the sixth node 712. The second electronic circuit portion 716 comprises the second node 704, the third node 706, and the fourth node 708.

The second voltage difference between the fifth node 710 and the sixth node 712 of the first electronic circuit portion

714 has an inverse relationship with the control voltage 703. The first current 707 generated at the third node 706 of the second electronic circuit portion 716 has a direct relationship with the second voltage difference between the fifth node 710 and the sixth node 712 of the first electronic circuit portion 714.

In some embodiments, second voltage difference between the fifth node 710 and the sixth node 712 of the first electronic circuit portion 714 has a reciprocal relationship with the control voltage 703.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Elements of embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. An electronic circuit disposed on a semiconductor substrate, the electronic circuit comprising:
   a first node configured to receive a control voltage from outside of the electronic circuit;
   a second node configured to receive a first signal voltage from outside of the electronic circuit;
   a third node configured to generate a first current to outside of the electronic circuit,
   wherein a relationship between the first current and the first signal voltage is described by a transconductance,
   wherein the transconductance has an inverse relationship with the control voltage,
   a fourth node configured to receive a second signal voltage from outside of the electronic circuit, wherein the first current has a direct relationship with a first voltage difference between the first and second signal voltages,
   wherein the electronic circuit comprises:
      a first electronic circuit portion; and
      a second electronic circuit portion coupled to the first electronic circuit portion,
   wherein the first electronic circuit portion comprises the first node and fifth and sixth nodes, wherein the first electronic circuit portion is configured to generate a second voltage difference between the fifth and sixth nodes,
   wherein the second electronic circuit portion comprises the second, the third, and the fourth nodes,
   wherein the first electronic circuit portion comprises:
      first and second resistors coupled in a voltage divider having first and second ends and a junction terminal coupling the first and second resistors, the first end of the voltage divider coupled to the first node of the first electronic circuit portion;
      first, second, third, and fourth transistors coupled as a first differential transconductance amplifier having first and second voltage input terminals and a current output terminal, the first voltage input terminal of the first differential transconductance amplifier coupled to the junction terminal of the voltage divider and the second voltage input terminal of the first differential transconductance amplifier coupled to a reference voltage, the first differential transconductance amplifier configured to generate a comparison current at the current output terminal of the first differential transconductance amplifier;
      a resistor coupled to the comparison current, wherein the resistor is configured to generate a comparison voltage related to the comparison current;
      a differential voltage amplifier having first and second voltage input terminals and a voltage output terminal, the first voltage input terminal of the differential voltage amplifier coupled to the comparison voltage and the second voltage input terminal of the differential voltage amplifier coupled to a first voltage source; and
      a fifth transistor having first and second current passing terminals and having a control terminal, wherein the control terminal of the fifth transistor is coupled to the voltage output terminal of the differential voltage amplifier, wherein the second current passing terminal of the fifth transistor is coupled to the first differential transconductance amplifier and the first current passing terminal of the fifth transistor is coupled to a second voltage source.

2. The electronic circuit of claim 1, wherein the transconductance has a reciprocal relationship with the control voltage.

3. The electronic circuit of claim 1, wherein the second voltage difference between the fifth and sixth nodes of the first electronic circuit portion has an inverse relationship with the control voltage,
   wherein the first current generated at the third node of the second electronic circuit portion has a direct relationship with the second voltage difference between the fifth and sixth nodes of the first electronic circuit portion.

4. The electronic circuit of claim 1, wherein the second electronic circuit portion comprises:
   a sixth transistor having first and second current passing terminals and having a control terminal, wherein the control terminal of the sixth transistor is coupled to the control terminal of the fifth transistor, wherein the first current passing terminal of the sixth transistor is coupled to the second voltage source; and
   seventh, eighth, nineth, and tenth transistors coupled as a second differential transconductance amplifier having first and second voltage input terminals and a current output terminal,
   wherein the first voltage input terminal of the second differential transconductance amplifier corresponds to the second node of the second electronic circuit portion;
   wherein the second voltage input terminal of the second differential transconductance amplifier corresponds to the fourth node of the second electronic circuit portion,
   wherein the current output terminal of the second differential transconductance amplifier corresponds to the third node of the second electronic circuit portion,
   wherein the second current passing terminal of the sixth transistor is configured to provide a bias current to the second differential transconductance amplifier, and
   wherein the bias current has an inverse relationship with the control voltage received at the first node of the first electronic circuit portion.

5. An electronic circuit disposed on a semiconductor substrate, the electronic circuit comprising:

a first node configured to receive a control voltage from outside of the electronic circuit;

a second node configured to receive a first signal voltage from outside of the electronic circuit;

a third node configured to generate a first current to outside of the electronic circuit, wherein a relationship between the first current and the first signal voltage is described by a transconductance, wherein the transconductance has an inverse relationship with the control voltage, a fourth node configured to receive a second signal voltage from outside of the electronic circuit, wherein the first current has a direct relationship with a first voltage difference between the first and second signal voltages, wherein the electronic circuit comprises:

a first electronic circuit portion; and a second electronic circuit portion coupled to the first electronic circuit portion, wherein the first electronic circuit portion comprises the first node and fifth and sixth nodes, wherein the first electronic circuit portion is configured to generate a second voltage difference between the fifth and sixth nodes, wherein the second electronic circuit portion comprises the second, the third, and the fourth nodes, wherein the first electronic circuit portion comprises:

a resistor having first and second terminals, the first terminal of the resistor coupled to the first node of the first electronic circuit portion and operable to receive the control voltage;

a first transistor having first and second current passing terminals and having a control terminal, the control terminal of the first transistor coupled to the first current passing terminal of the first transistor, the second terminal of the resistor coupled to the control terminal of the first transistor;

a second transistor having first and second current passing terminals and having a control terminal, the control terminal of the second transistor coupled to the control terminal of the first transistor, the second transistor forming a first current mirror with the first transistor;

a third transistor having first and second current passing terminals and having a control terminal, the control terminal of the third transistor coupled to the control terminal of the first transistor, the third transistor forming a second current mirror with the first transistor;

a fourth transistor having first and second current passing terminals and having a control terminal, the control terminal of the fourth transistor coupled to a voltage source, the first current passing terminal of the fourth transistor coupled to the voltage source, the second current passing terminal of the fourth transistor coupled to the first current passing terminal of the second transistor at a first junction terminal; and a fifth transistor having first and second current passing terminals and having a control terminal, the control terminal of the fifth transistor coupled to the voltage source, the first current passing terminal of the fifth transistor coupled to the voltage source, the second current passing terminal of the fifth transistor coupled to the first current passing terminal of the third transistor at a second junction terminal, wherein the first junction terminal corresponds to the fifth node of the first electronic circuit portion, and wherein the second junction terminal corresponds to the sixth node of the first electronic circuit portion.

6. The electronic circuit of claim 5, wherein the second electronic circuit portion comprises:

first differential transconductance amplifier having first and second voltage input terminals and first and second current output terminals, the first current output terminal of the first differential transconductance amplifier coupled to the second current passing terminal of the fourth transistor, and the second current output terminal of the first differential transconductance amplifier coupled to the second current passing terminal of the fifth transistor; and sixth, seventh, eighth, and nineth transistors coupled as second differential transconductance amplifier having first and second voltage input terminals and a current output terminal, wherein the first voltage input terminal of the first differential transconductance amplifier corresponds to the second node of the second electronic circuit portion, wherein the second voltage input terminal of the first differential transconductance amplifier corresponds to the fourth node of the second electronic circuit portion, and wherein the current output terminal of the second differential transconductance amplifier corresponds to the third node of the second electronic circuit portion.

7. A switching regulator having a voltage input terminal at which a supply voltage is received and an output terminal at which a regulated voltage is generated, the switching regulator comprising a switch having first and second terminals and a control terminal, the switching regulator further comprising an inductor, a capacitor, and a feedback circuit having first and second input terminals and an output terminal, wherein the feedback circuit comprises:

a current sensor configured to generate a current-related voltage signal, the current-related voltage signal related to a current passing through the inductor; and a first transconductance amplifier, comprising:

a first node configured to receive a control voltage, the control voltage related to the supply voltage;

a second node configured to receive a first signal voltage, the first signal voltage related to the current-related voltage signal;

a third node configured to generate a first current; and a fourth node configured to receive a second signal voltage, the second signal voltage related to the regulated voltage; and the feedback circuit further comprising:

a pulse width modulation circuit having an input terminal and an output terminal, wherein the output terminal of the pulse width modulation circuit is coupled to the control terminal of the switch and the input terminal of the pulse width modulation circuit is coupled to the third node of the first transconductance amplifier; and an impedance circuit coupled between the third node and a reference voltage, wherein the impedance circuit is operable to generate a feedback voltage related to the first current and related to the regulated voltage, wherein a relationship between the first current and a first voltage difference between the first signal voltage and the second signal voltage is described by a transconductance, wherein the transconductance has an inverse relationship with the control voltage, wherein the first transconductance amplifier comprises:

a first electronic circuit portion; and a second electronic circuit portion coupled to the first electronic circuit portion, wherein the first electronic circuit portion comprises the first node and fifth and sixth nodes, wherein the first electronic circuit portion is configured to generate a second voltage difference between the fifth and sixth nodes, wherein the second electronic circuit portion comprises the second, the third, and the fourth nodes, wherein the second voltage difference between the fifth and sixth nodes of the first electronic circuit portion has an inverse relationship with the control voltage, wherein the first current generated at the third node of the second electronic circuit portion has a direct relationship with the second voltage difference between the fifth and sixth nodes of the first electronic circuit portion, wherein the feedback circuit further comprises:

a feedback amplifier coupled to the output terminal of the switching regulator, the feedback amplifier having an input terminal and an output terminal, the feedback amplifier configured to generate a voltage at the output terminal of the feedback amplifier related to the regulated voltage at the output terminal of the switching regulator, wherein the output terminal of the feedback amplifier is coupled to the fourth node of the first transconductance amplifier, wherein the feedback amplifier comprises a second transconductance amplifier.

8. The switching regulator of claim 7, wherein the transconductance has a reciprocal relationship with the control voltage.

9. The switching regulator of claim 7, wherein the pulse width modulation circuit comprises:

a ramp generator circuit for generating a periodic ramp signal;

a comparator having first and second input terminals and an output terminal, wherein the first input terminal of the comparator is coupled to the period ramp signal and the second input terminal of the comparator is coupled to the third node of the first transconductance amplifier; and a logic gate circuit coupled between the output terminal of the comparator and the control terminal of the switch.

10. The switching regulator of claim 9, wherein the periodic ramp signal has a constant peak amplitude regardless of a value of the supply voltage at the voltage input terminal of the switching regulator.

11. The switching regulator of claim 7, wherein the pulse width modulation circuit comprises:

a ramp generator circuit for generating a periodic ramp signal;

a comparator having first and second input terminals and an output terminal, wherein the first input terminal of the comparator is coupled to the period ramp signal and the second input terminal of the comparator is coupled to the third node of the first transconductance amplifier; and a logic gate circuit coupled between the output terminal of the comparator and the control terminal of the switch.

12. The switching regulator of claim 11, wherein the periodic ramp signal has a constant peak amplitude regardless of a value of the supply voltage at the voltage input terminal of the switching regulator.

13. The switching regulator of claim 7, wherein the switch, the inductor, and the capacitor are coupled to form a buck converter.

14. The switching regulator of claim 7, wherein the switch, the inductor, and the capacitor are coupled to form a boost converter.

15. A switching regulator having a voltage input terminal at which a supply voltage is received and an output terminal at which a regulated voltage is generated, the switching regulator comprising a switch having first and second terminals and a control terminal, the switching regulator further comprising an inductor, a capacitor, and a feedback circuit having first and second input terminals and an output terminal, wherein the feedback circuit comprises:

a current sensor configured to generate a current-related voltage signal, the current-related voltage signal related to a current passing through the inductor; and a first transconductance amplifier, comprising:

a first node configured to receive a control voltage, the control voltage related to the supply voltage;

a second node configured to receive a first signal voltage, the first signal voltage related to the current-related voltage signal;

a third node configured to generate a first current; and a fourth node configured to receive a second signal voltage, the second signal voltage related to the regulated voltage; and the feedback circuit further comprising:

a pulse width modulation circuit having an input terminal and an output terminal, wherein the output terminal of the pulse width modulation circuit is coupled to the control terminal of the switch and the input terminal of the pulse width modulation circuit is coupled to the third node of the first transconductance amplifier; and an impedance circuit coupled between the third node and a reference voltage, wherein the impedance circuit is operable to generate a feedback voltage related to the first current and related to the regulated voltage, wherein a relationship between the first current and a first voltage difference between the first signal voltage and the second signal voltage is described by a transconductance, wherein the transconductance has an inverse relationship with the control voltage, wherein the feedback circuit is operable to provide stable operation of the switching regulator for a ratio of a largest value of the supply voltage to a smallest value of the supply voltage of at least twenty.

* * * * *